United States Patent
Wang et al.

(10) Patent No.: US 9,691,860 B2
(45) Date of Patent: Jun. 27, 2017

(54) METHODS OF FORMING DEFECT-FREE SRB ONTO LATTICE-MISMATCHED SUBSTRATES AND DEFECT-FREE FINS ON INSULATORS

(71) Applicant: Samsung Electronics Co., Ltd., Suwon-si, Gyeonggi-do (KR)

(72) Inventors: Wei-E Wang, Austin, TX (US); Mark S. Rodder, Dallas, TX (US); Rwik Sengupta, Austin, TX (US)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/698,817

(22) Filed: Apr. 28, 2015

(65) Prior Publication Data
US 2015/0318355 A1    Nov. 5, 2015

Related U.S. Application Data

(60) Provisional application No. 61/988,033, filed on May 2, 2014.

(51) Int. Cl.
*H01L 29/10*  (2006.01)
*H01L 29/165*  (2006.01)
(Continued)

(52) U.S. Cl.
CPC ........ *H01L 29/165* (2013.01); *H01L 21/0245* (2013.01); *H01L 21/0265* (2013.01);
(Continued)

(58) Field of Classification Search
CPC ............... H01L 29/165; H01L 21/0265; H01L 21/02639; H01L 21/0245; H01L 21/02381; H01L 21/02532; H01L 29/66; H01L 29/1054; H01L 29/66795; H01L 45/124; H01L 21/0242; H01L 21/02422; H01L 21/02488
(Continued)

(56) References Cited

U.S. PATENT DOCUMENTS

| | | | |
|---|---|---|---|
| 8,685,842 B2 | 4/2014 | Oda et al. | |
| 2002/0168802 A1* | 11/2002 | Hsu | H01L 29/78687 438/149 |

(Continued)

*Primary Examiner* — Julio J Maldonado
*Assistant Examiner* — Stanetta Isaac
(74) *Attorney, Agent, or Firm* — Renaissance IP Law Group LLP

(57) ABSTRACT

A strain-relieved buffer is formed by forming a first silicon-germanium (SiGe) layer directly on a surface of a bulk silicon (Si) substrate. The first SiGe layer is patterned to form at least two SiGe structures so there is a space between the SiGe structures. An oxide is formed on the SiGe structures, and the SiGe structures are mesa annealed. The oxide is removed to expose a top portion of the SiGe structures. A second SiGe layer is formed on the exposed portion of the SiGe structures so that the second SiGe layer covers the space between the SiGe structures, and so that a percentage Ge content of the first and second SiGe layers are substantially equal. The space between the SiGe structures is related to the sizes of the structures adjacent to the space and an amount of stress relief that is associated with the structures.

20 Claims, 10 Drawing Sheets

(51) Int. Cl.
  *H01L 29/66* (2006.01)
  *H01L 21/02* (2006.01)
(52) U.S. Cl.
  CPC .. *H01L 21/02381* (2013.01); *H01L 21/02532* (2013.01); *H01L 21/02639* (2013.01); *H01L 29/1054* (2013.01); *H01L 29/66* (2013.01); *H01L 29/66795* (2013.01)
(58) Field of Classification Search
  USPC .......................................................... 438/479
  See application file for complete search history.

(56) References Cited

U.S. PATENT DOCUMENTS

| | | | |
|---|---|---|---|
| 2008/0206934 A1* | 8/2008 | Jones | H01L 21/84 438/151 |
| 2013/0228864 A1 | 9/2013 | Mieno | |
| 2015/0279973 A1* | 10/2015 | Akarvardar | H01L 29/1054 438/283 |

\* cited by examiner

FIG. 5

METHODS OF FORMING DEFECT-FREE SRB ONTO LATTICE-MISMATCHED SUBSTRATES AND DEFECT-FREE FINS ON INSULATORS

CROSS-REFERENCE TO RELATED APPLICATION

This application claims priority under 35 U.S.C. §120 to U.S. Provisional Patent Application Ser. No. 61/988,033, filed on May 2, 2014, the contents of which are incorporated by reference in their entirety herein.

BACKGROUND

Silicon Germanium (SiGe) on insulator (SiGeOI) provides some advantages for semiconductor device scaling, such as, a high carrier velocity due to Ge addition and low leakage due to presence of the buried oxide (BOX) below the SiGe. Several conventional techniques are used to form SiGeOI layers, such as a wafer bonding technique, a bond and etch-back technique, a rapid-melt-growth technique, or Ge condensation. Nevertheless, it remains challenging to form a thick SiGeOI structure (i.e., greater than 20 nm thick) that is defect-free and that has a very high Ge percentage content.

SUMMARY

Exemplary embodiments provide a method to form a strain-relieved buffer (SRB).

In some exemplary embodiments, the method comprises forming a first silicon-germanium (SiGe) layer directly on a surface of a bulk silicon (Si) substrate; patterning the first SiGe layer to form at least two SiGe structures so there is a space between the at least two SiGe structures; forming an oxide on the at least two SiGe structures; mesa annealing the at least two SiGe structures; removing a portion of the oxide to expose a top portion of the at least two SiGe structures; and forming a second SiGe layer on the exposed top portion of the at least two SiGe structures in which the second SiGe layer covers the space between the at least two SiGe structures.

In some exemplary embodiments, forming the first SiGe layer comprises forming the first SiGe layer by epitaxial deposition, and forming the second SiGe layer comprises forming the second SiGe layer by epitaxial deposition.

In some exemplary embodiments, a percentage Ge content of the first SiGe layer is substantially equal to a percentage Ge content of the second SiGe layer. In some exemplary embodiments, the percentage Ge content of the second SiGe layer is greater than 30%. In some exemplary embodiments, the percentage Ge content of the second SiGe layer is greater than 85%. In some exemplary embodiments, a threading dislocation (TD) density (TDD) of the second SiGe layer is less than $1 \times 10^5$ TD/cm$^2$. In some exemplary embodiments, a TDD of the second SiGe layer is less than $1 \times 10^3$ TD/cm$^2$.

In some exemplary embodiments, patterning the first SiGe layer comprises patterning the first SiGe layer so that each SiGe structure comprises a length and a width in a direction along the surface of the bulk Si substrate, in which the space between each SiGe structure comprises a predetermined distance between each SiGe structure, and the predetermined distance is related to the length and the width of the SiGe structures adjacent to the space and an amount of stress relief that is associated with each SiGe structure.

In some exemplary embodiments, the SRB is part of a System on a Chip (SOC), and in some exemplary embodiments, the SOC is part of an electronic device comprising a touch-screen display.

Exemplary embodiments provide a method to form a strain-relieved buffer (SRB). In some exemplary embodiments, the method comprises forming a first silicon-germanium (SiGe) layer on a surface of a substrate; patterning the first SiGe layer to form at least two SiGe structures so there is a space between the at least two SiGe structures, in which each SiGe structure comprises a length and a width in a direction along the surface of the substrate and a height in a direction that is substantially perpendicular to the surface of the substrate in which the space between each SiGe structure comprises a predetermined distance between each SiGe structure, and the predetermined distance is related to the length, the width and the height of the SiGe structures adjacent to the space and an amount of stress relief that is associated with each SiGe structure; forming an oxide on the at least two SiGe structures; mesa annealing the at least two SiGe structures; removing a portion of the oxide to expose a top portion of the at least two SiGe structures; and forming a second SiGe layer on the exposed top portion of the at least two SiGe structures, in which the second SiGe layer covers the space between the at least two SiGe structures.

In some exemplary embodiments, the substrate is a bulk silicon (Si) substrate, and the first silicon-germanium (SiGe) layer is formed directly on the surface of the bulk Si substrate.

In some exemplary embodiments, forming the first SiGe layer comprises forming the first SiGe layer by epitaxial deposition, and forming the second SiGe layer comprises forming the second SiGe layer by epitaxial deposition.

In some exemplary embodiments, a percentage Ge content of the first SiGe layer is substantially equal to a percentage Ge content of the second SiGe layer. In some exemplary embodiments, the percentage Ge content of the second SiGe layer is greater than 30%. In some exemplary embodiments, the percentage Ge content of the second SiGe layer is greater than 85%. In some exemplary embodiments, a TDD of the second SiGe layer is less than $1 \times 10^5$ TD/cm$^2$. In some exemplary embodiments, a TDD of the second SiGe layer is less than $1 \times 10^3$ TD/cm$^2$. In some exemplary embodiments, the SRB is part of a System on a Chip (SOC), and in some exemplary embodiments, the SOC is part of an electronic device comprising a touch-screen display.

Exemplary embodiments provide a method to form a strain-relieved buffer (SRB). In some exemplary embodiments, the method comprises forming a first silicon-germanium (SiGe) layer on a surface of a substrate; patterning the first SiGe layer to form at least two SiGe structures so there is a space between the at least two SiGe structures; forming an oxide on the at least two SiGe structures; mesa annealing the at least two SiGe structures; removing a portion of the oxide to expose a top portion of the at least two SiGe structures; and forming a second SiGe layer on the exposed top portion of the at least two SiGe structures, in which the second SiGe layer covers the space between the at least two SiGe structures, and a percentage Ge content of the first SiGe layer is substantially equal to a percentage Ge content of the second SiGe layer.

In some exemplary embodiments, the substrate is a bulk silicon (Si) substrate, and the first silicon-germanium (SiGe) layer is formed directly on the surface of the bulk Si substrate.

In some exemplary embodiments, each SiGe structure comprises a length and a width in a direction along the surface of the substrate and a height in a direction that is substantially perpendicular to the surface of the substrate, in which the space between each SiGe structure comprises a predetermined distance between each SiGe structure, and the predetermined distance is related to the length, the width and the height of the SiGe structures adjacent to the space and an amount of stress relief that is associated with each SiGe structure. In some exemplary embodiments, forming the first SiGe layer comprises forming the first SiGe layer by epitaxial deposition, and forming the second SiGe layer comprises forming the second SiGe layer by epitaxial deposition.

In some exemplary embodiments, the percentage Ge content of the second SiGe layer is greater than 30%. In some exemplary embodiments, the percentage Ge content of the second SiGe layer is greater than 85%. In some exemplary embodiments, a TDD of the second SiGe layer is less than $1 \times 10^5$ TD/cm$^2$. In some exemplary embodiments, a TDD of the second SiGe layer is less than $1 \times 10^3$ TD/cm$^2$.

In some exemplary embodiments, the SRB is part of a System on a Chip (SOC), and in some exemplary embodiments, the SOC is part of an electronic device comprising a touch-screen display.

Exemplary embodiments also provide a semiconductor device. In some exemplary embodiments, a semiconductor device a strain-relieved buffer (SRB) that comprises at least two silicon-germanium (SiGe) structures formed on a surface of a substrate in which the at least two SiGe structures comprise a length and a width in a direction along the surface substrate, and a height in a direction that is substantially perpendicular to the surface of the substrate. In some exemplary embodiments, the substrate comprises a bulk silicon (Si) substrate and the at least two SiGe structures are formed directly on the bulk Si substrate. In some exemplary embodiments, a space is formed between the at least two SiGe structures in which the space comprises a predetermined distance that is related to the length, the width and the height of the SiGe structures adjacent to the space and an amount of stress relief that is associated with each SiGe structure. In some exemplary embodiments, the semiconductor device further comprises a second SiGe layer formed on and covers the at least two SiGe structures and the space between the at least two SiGe structures. In some exemplary embodiments, the second SiGe layer comprises a percentage Ge content that is substantially equal to the percentage Ge content of the at least two silicon-germanium structures.

In some exemplary embodiments the length of at least one SiGe structure comprises about 100 nm to about 2 µm, and the width of at least one SiGe structure comprises about 100 nm to about 2 µm, and the height comprises about 30 nm to about 100 nm. In some exemplary embodiments, at least one SiGe structure comprises a thickness of about 100 nm to about 1 µm in which the thickness of the at least one SiGe structure is in a direction that is perpendicular to the directions of the length and the width of the at least one SiGe structure.

In some exemplary embodiments, the percentage Ge content of the second SiGe layer is greater than 30%. In some exemplary embodiments, the percentage Ge content of the second SiGe layer is greater than 85%. In some exemplary embodiments, a TDD of the second SiGe layer is less than $1 \times 10^5$ TD/cm$^2$. In some exemplary embodiments, a TDD of the second SiGe layer is less than $1 \times 10^3$ TD/cm$^2$.

In some exemplary embodiments, the semiconductor device is part of a System on a Chip (SOC), and in some exemplary embodiments, the SOC is part of an electronic device comprising a touch-screen display.

BRIEF DESCRIPTION OF THE DRAWINGS

Example embodiments will be more clearly understood from the following detailed description taken in conjunction with the accompanying drawings. The Figures represent non-limiting, example embodiments as described herein.

FIG. 5 depicts an exemplary arrangement of components of a System on a Chip (SOC) that comprises one or more semiconductor devices according to the subject matter disclosed herein;

DESCRIPTION OF EMBODIMENTS

Figure 1A:
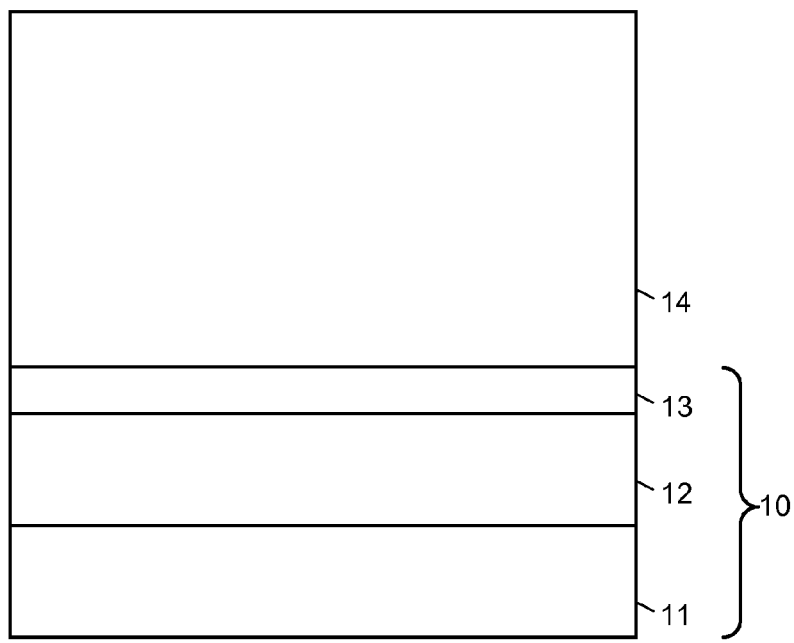
FIGS. 1A-1D depict a cross-sectional view of an exemplary embodiment of a semiconductor device comprising a plurality of silicon-germanium fins at different stages of an exemplary fabrication process according to the subject matter disclosed herein.

The subject matter disclosed herein provides a strain-relieved buffer that is formed by forming a first silicon-germanium (SiGe) layer directly on a surface of a substrate, such as a bulk silicon (Si) substrate or a silicon on insulator (SOI) substrate. The first SiGe layer is patterned to form at least two SiGe structures so there is a space between the SiGe structures. An oxide is formed on the SiGe structures before the SiGe structures are mesa annealed. The oxide is removed to expose a top portion of the SiGe structures. A second SiGe layer is formed on the exposed portion of the SiGe structures so that the second SiGe layer covers completely the space between the SiGe structures, and so that a percentage Ge content of the first and second SiGe layers are substantially equal. The space between the SiGe structures is related to the sizes of the structures adjacent to the space and an amount of stress relief that is associated with the structures from the lattice-mismatch between the chosen Ge content SiGe deposited and silicon layer below.

Various exemplary embodiments will be described more fully hereinafter with reference to the accompanying drawings, in which some exemplary embodiments are shown. As used herein, the word "exemplary" means "serving as an example, instance, or illustration." Any embodiment described herein as "exemplary" is not to be construed as necessarily preferred or advantageous over other embodiments. The subject matter disclosed herein may, however, be embodied in many different forms and should not be construed as limited to the exemplary embodiments set forth herein. Rather, the exemplary embodiments are provided so that this description will be thorough and complete, and will fully convey the scope of the claimed subject matter to those skilled in the art. In the drawings, the sizes and relative sizes of layers and regions may be exaggerated for clarity.

It will be understood that when an element or layer is referred to as being on, "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of the claimed subject matter. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the claimed subject matter.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The subject matter disclosed herein provides very tall and thin defect-free SiGe fins that are formed on regular SOI wafers using typical semiconductor processing steps. The subject matter disclosed herein is also provides a fully relaxed SiGe strain-relieved buffer (SRB) on regular silicon wafers independent of Ge content. Thus, fins and SRBs can be formed directly on a SiGe EPI following exactly the specific layout needed for the targeted devices/products and no modifications whatsoever are needed in terms of fins dimension and layout. Additionally, the subject matter disclosed herein is able to provide SiGe SRBs having selectable Ge contents, which is beneficial for subsequent stress engineering.

One of the benefits of the subject matter disclosed herein is that no special SiGeOI wafers are specifically required for generating a SiGe fin on an insulator because the starting wafer is a commercially available SOI as opposed to a SiGeOI starting wafer, which is not commercially available. Another benefit is that the processes used for forming a fin according to the subject matter disclosed herein are all typical semiconductor processes, for example, a conformal oxide deposition to cover a fin, an oxide strip using a typical HF clean, and a typical thermal-mixing anneal in a typical diffusion furnace. Accordingly, a costly high-temperature and long-duration anneal, such as that associated with a Ge condensation technique, are avoided. Still another benefit is that a very tall fin can be formed in the process because a thicker (i.e., taller) mesa is actually beneficial in generating a large image force.

A conventional Ge-condensation technique uses selective silicon oxidation of a SiGe layer that has been grown on a silicon-on-insulator (SOI) substrate and that has an initially relatively low Ge content. During oxidation of the SiGe layer, silicon atoms diffuse through the SiGe layer and react with oxygen to form an oxide layer. In the process, the resulting silicon oxide and the BOX layer (also a silicon oxide layer) underneath act as Ge diffusion barriers so that the resulting SiGeOI structure, while having been thinned during the selective Si oxidation, comprises a Ge-enriched film. Nevertheless, it remains challenging to form a thick SiGeOI (i.e., greater than 20 nm) that is defect-free and that has a very high Ge percentage content.

It has been suggested that there may be a limit for generating a defect-free, non-patterned SiGeOI substrate (i.e., Ge=82%). See, for example, B. Vincent et al, "Stacking fault generation during relaxation of silicon germanium on insulator layers obtained by the Ge condensation technique," Appl. Phys. Lett. 90, 074101 (2007), and "The Ge condensation technique: A solution for planar SOI/GeOI co-integration for advanced CMOS technologies?" Mater. Sci. Semi. Proc. 11, 205 (2008). Thus, it may be that a conventional Ge-condensation technique cannot be used to generate a high-quality SiGeOI having a Ge content that is greater than 82%.

Another approach, referred to as a patterned-wafer approach or a mesa-anneal approach uses a patterned wafer (i.e., a large area mesa having a size of up to a few microns) to yield a defect-free SiGeOI. The empty spaces around a patterned mesa produce an image force that attracts, or forces, defects, such as dislocations that are located inside the mesa and that originate from a lattice mismatch between the thick layer of SiGe and the SOI, to move to the edge of the mesa and "disappear" into the empty space. See, for example, T. Tezuka, N. Sugiyama, S. Takagi, and T. Kawakubo, "Dislocation-free formation of relaxed SiGe-on-insulator layers," Appl. Phys. Lett., vol. 80, no. 19, p. 3560, 2002. Defect movement is activated by a very high condensation-temperature anneal (1200-1250° C.) of the mesas (mesa anneal). The result is a defective-free SiGe mesa layer on insulator having no cross-hatch pattern at the bottom of the mesa, thereby indicating no misfit dislocations (MDs) and threading dislocations (TDs) in the mesa.

While a SiGeOI formed by a patterned-mesa technique is defect-free, the direct application of forming high-content Ge mesas using a patterned-mesa technique into high-volume CMOS processing is, however, non-trivial. For example, a large-area (μm) mesa has a significant morphology issue due to the empty spaces between the mesas. That is, the empty spaces surrounding a large-area mesa need to be filled with insulating oxides before further processing. A subsequent chemical-mechanical planarization (CMP) step is then needed to planarize the deposited oxide and to expose the SiGe surface of a mesa. Additionally, the stringent requirements of high temperature and the long anneal time associated with a mesa-anneal technique are costly from a perspective of high-volume manufacturing.

As a practical matter, some dislocations are created to relax the strain caused from certain lattice mismatches. Each dislocation is denoted by its Burger vector b that has a size of about 4-5 Å. That is, each dislocation takes about 4-5 Å in space. To relax, for example, a 1% mismatch strain, a large number of dislocations are generated. The number of dislocations needed to account for, or comprehend, a 1% strain is $2 \times 10^5$/cm. In two dimensions, the amount of space that a 1% strain comprehends is $4 \times 10^{10}$/cm². On the other hand, a certain amount of open space is needed to accommodate the free space that is released by the elimination of large number of dislocations (i.e., stress relief). For example, a 3 mm extra linear space is needed from a 300 mm wafer full of high-density dislocation generated from 1% strain. The extra space that is needed (3 mm or even greater) is comprehended by the non-active isolation oxide areas that are typically formed between fins.

FIGS. 1A-1D depict a cross-sectional view of an exemplary embodiment of a semiconductor device comprising a plurality of silicon-germanium fins at different stages of an exemplary fabrication process according to the subject matter disclosed herein. FIG. 2 depicts an exemplary embodiment of a method 20 to form the exemplary semiconductor device of FIGS. 1A-1D according to the subject matter disclosed herein. Although FIGS. 1A-1D depict a semiconductor device comprising a plurality of fins, it should be understood that a semiconductor device according to the subject matter disclosed herein could comprise only one fin. Similarly, although FIG. 2 depicts a method for forming a semiconductor device comprising a plurality of fins, it should be understood that a method for forming a semiconductor device according to the subject matter disclosed herein could form a semiconductor device comprising only one fin.

In FIG. 1A, a silicon on insulator (SOI) 10 comprises a silicon (Si) substrate 11, a buried oxide (BOX) layer 12, and a silicon (Si) layer 13. In one exemplary embodiment, BOX layer 12 is about 5 nm to about 20 nm thick, and silicon layer 13 is about 3 nm to about 5 nm thick. At operation 21 in FIG. 2, a SiGe layer 14 having a thickness of about 30 nm to about 100 nm is epitaxially grown in a well-known manner directly on SOI 10 by, for example, chemical vapor deposition (CVD). Threading dislocations (TD), indicated in FIG. 1B, can be expected to form in SiGe layer 14 after the EPI process.

Figure 1B:
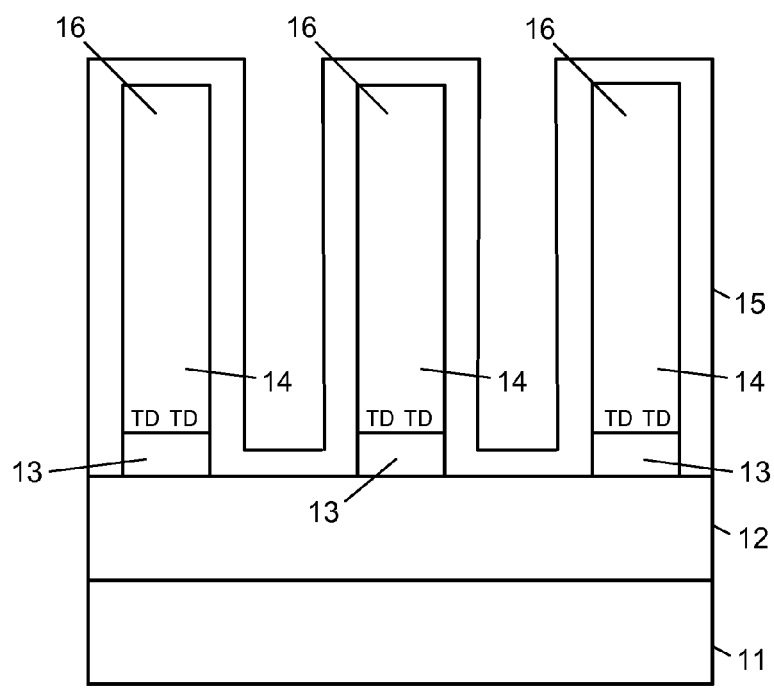
Figure 2:
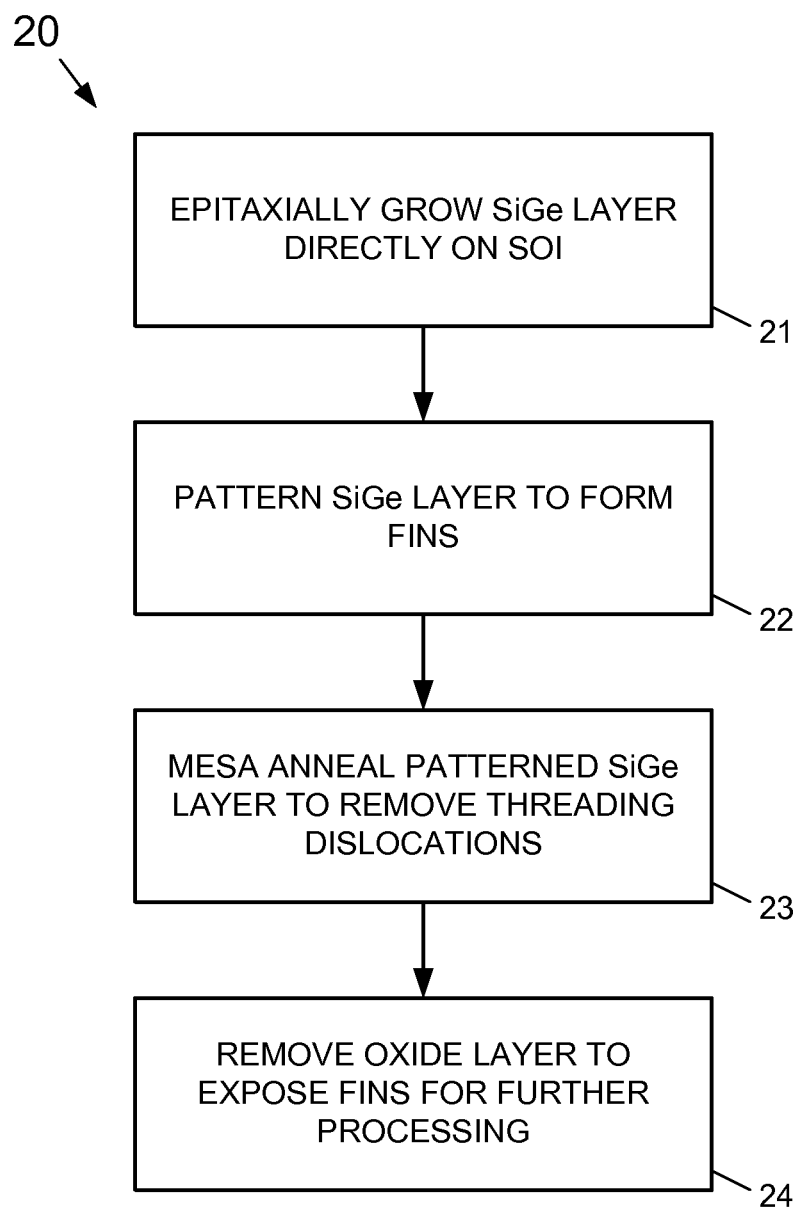
FIG. 2 depicts an exemplary embodiment of a method to form the exemplary semiconductor device of FIGS. 1A-1D according to the subject matter disclosed herein.

At operation 22 in FIG. 2, the SiGe layer 14 depicted in FIG. 1B has been patterned in a well-known manner to form fins 16. An oxide layer 15 of about 3 nm to about 5 nm thick is formed in a well-known manner to protect the SiGe layer 14 from reflow during a later mesa anneal process. In one exemplary embodiment, an atomic layer deposition (ALD) technique is used to form a conformal layer of $SiO_2$. The oxide layer 15 covering a SiGe fin could be a dielectric other than $SiO_2$ as long as the dielectric has a weak shear strength for easy dislocation movement, has sufficient strength to protect a SiGe fin from a deforming reflow during the mesa anneal, and is easily removed later after the mesa anneal.

Each fin 16 formed after patterning and etching is treated as a mesa and subjected to a mesa-anneal process. That is, a thermal-mixing anneal is applied to each fin/mesa, which enclosed by an oxide to avoid a potential reflow issue, to drive the dislocations out of the fin into the free space outside of the fin.

Figure 1C:
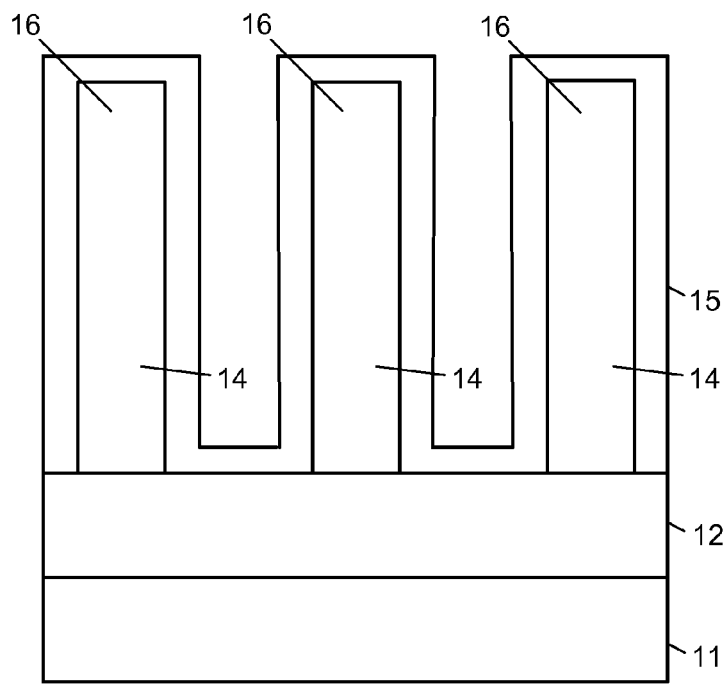

At operation 23 in FIG. 2, a mesa anneal is performed on the patterned SiGe layer 14 in FIG. 1C to remove threading dislocations (TD) by gliding using an image force that is created by the spaces formed by the patterning. The mesa anneal provides the activation energy for the dislocations to be removed. Dislocations in the epitaxial structure glide under the influence of an image force, which is induced by a zero stress at the edge of a mesa, or in this case, at the edge of a fin. The mesa anneal also merges SiGe layer 14 with Si layer 13 to form an overall lower Ge-content SiGe. The mesa-anneal should have a temperature that is sufficiently high (e.g., 600-1000° C. in an $N_2$ atmosphere) to thermally mix the SiGe and Si in for about 10 minutes to about 2 hours, but low enough to avoid SiGe fin reflow, thereby keeping fin integrity.

At 24 in FIG. 2, the oxide layer 15 is removed from the patterned SiGe layer 14 using a well-known technique to expose the fins 16. Fins 16 are ready for further processing to form, for example, FinFETs.

In some exemplary embodiments, SiGe fins can be formed to provide a top portion that comprises a high Ge-content—generally with Ge % greater than about 85%, and with a Threading Dislocation Density (TDD) of less than about $1 \times 10^4$ TD/cm². In other exemplary embodiments, the subject matter disclosed herein provides SiGe fins comprising a top portion having a Ge % content that is generally greater than about 85%, and a TDD of less than about $1 \times 10^3$ TD/cm².

According to another exemplary embodiment, a mesa-anneal technique can also be used to form a completely relaxed and defect-free strain-relieved buffer (SRB) on a bulk silicon wafer. That is, mesas comprising, for example, about 100 nm to about 2-3 μm squares having thicknesses varying, for example, from about 100 nm to µms (if needed), can be formed in which the empty spaces between mesas are adequate to account for, or comprehend, a desired strain relaxation of the SRB. For example, a total of 4.2 mm of space is needed to comprehend an SRB of $SiGe_{0.3}$ for a 300 mm wafer.

According to the subject matter disclosed herein, a strain-relieved buffer (SRB) is formed by a two-step EPI process. The first step is to form a mesa comprising a SiGe layer having a Ge content that is equal to or substantially equal to the Ge content of the SiGe layer formed in the second step. Consequently, no mismatch exists between the SiGe from the first layer and the second layer. Additionally, the SiGe of the second SiGe EPI process is grown in a way to create an air-gap at the bottom of the open space between mesas.

More specifically, a first EPI process is used to form an SRB directly on a substrate in which the spaces surrounding the patterned mesas comprehend strain relaxation for the expected amount of defects in view of the sizes of the mesas, that is, the lengths and the widths in the direction along the surface of the bulk Si. A conformal oxide cap is formed on the mesas. Defects that are generated from the EPI process are annealed away by a mesa-anneal process, which also provides a relaxation of the mesas of 100%. A subsequent etch process removes an upper, or top, portion of the oxide cap to expose only the top portion of the SiGe deposited during the first EPI process and to thereby ensure formation of the air gap (void) because the second EPI process is selective against oxide.

After the top oxide cap has been removed, the wafer can go through a regular wet clean before a second EPI process. A typical high-temperature prebake (600-850° C./in $H_2$) is applied to the wafer for removal of native oxide. The top portion of the SiGe, which is unprotected by the removed oxide cap, may experience a reflow due to the low melting temperature of Ge and may deform. The deformation, however, may be tolerable.

The second EPI process is performed in which the SiGe has the same Ge content as the Ge content of the first EPI process. The second EPI process deposits SiGe not only selectively against oxide, but also to pinch off a top portion of the gap, or space, between mesas, which results in a void (i.e., an air-gap) being formed below the second EPI deposition. The pinch off provides a 100% closure of the top surface of the second EPI deposition. The potential reflow during the prebake can actually help to facilitate the pinch off. Additionally, the void that is created absorbs any residual strain relaxation that may be generated during any subsequent processing steps to accordingly provide a SRB that is completely defect-free. Additionally, the techniques disclosed herein can be performed on an SRB of any Ge-content because the process steps are independent of Ge content as long as the empty-space requirement between mesas is comprehended during mesa formation.

Thus, the subject matter disclosed herein is able to achieve a thin and fully relaxed SiGe-SRB on a regular silicon wafers independent of Ge content. Additionally, the subject matter disclosed herein is able to provide a SiGe SRB with various levels of Ge content, which is beneficial for the subsequent stress engineering, if desired.

FIGS. 3A-3D depict cross-sectional views of an exemplary embodiment of a semiconductor device comprising a plurality of strain-relieved buffers (SRBs) during different stages of fabrication according to the subject matter disclosed herein. FIG. 4 depicts an exemplary embodiment of a method 40 to form the exemplary semiconductor device of FIGS. 3A-3D according to the subject matter disclosed herein.

Figure 3A:
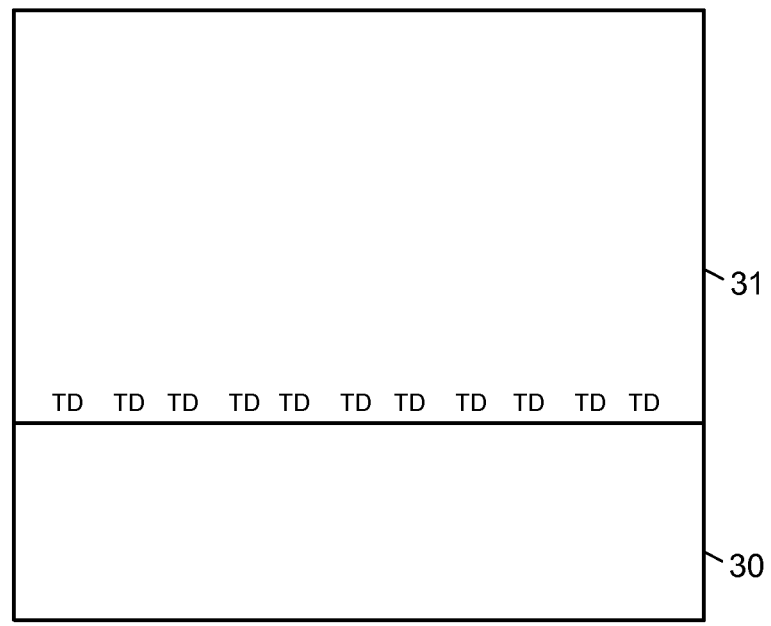
FIGS. 3A-3D depict cross-sectional views of an exemplary embodiment of a semiconductor device comprising a plurality of strain-relieved buffers (SRBs) during different stages of fabrication according to the subject matter disclosed herein.
Figure 4:
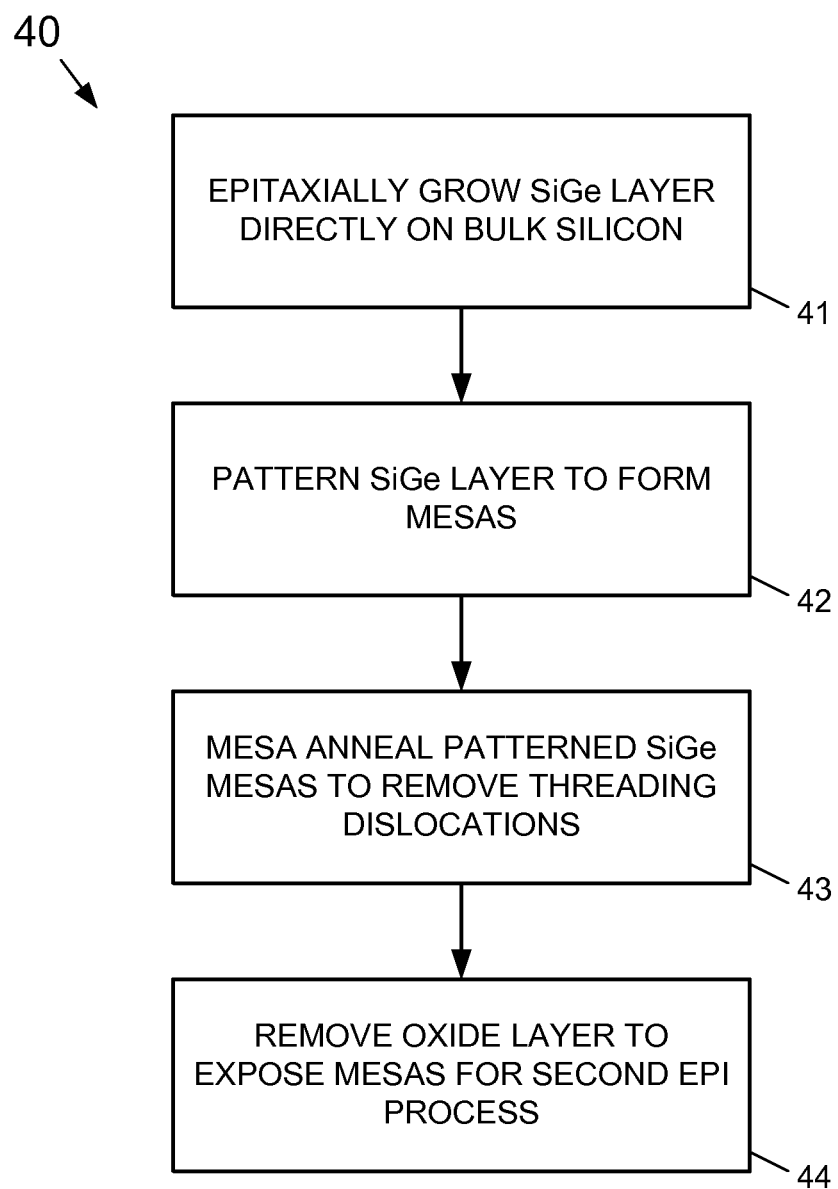
FIG. 4 depicts an exemplary embodiment of a method to form the exemplary semiconductor device of FIGS. 3A-3D according to the subject matter disclosed herein.

At 41 in FIG. 4, starting with bulk silicon (Si) 30, a silicon-germanium SiGe layer 31 is deposited using a well-known EPI technique, as depicted in FIG. 3A. For example, SiGe layer 31 is formed to have a thickness of about 30 nm to about 100 nm directly on bulk silicon 31 by, for example, chemical vapor deposition (CVD). The Ge content of layer 31 is selected to be equal to or substantially equal to the desired Ge content of the final SRB. Threading dislocations (TD), indicated in FIG. 3A, are formed in SiGe layer 31 during the EPI process.

Figure 3B:
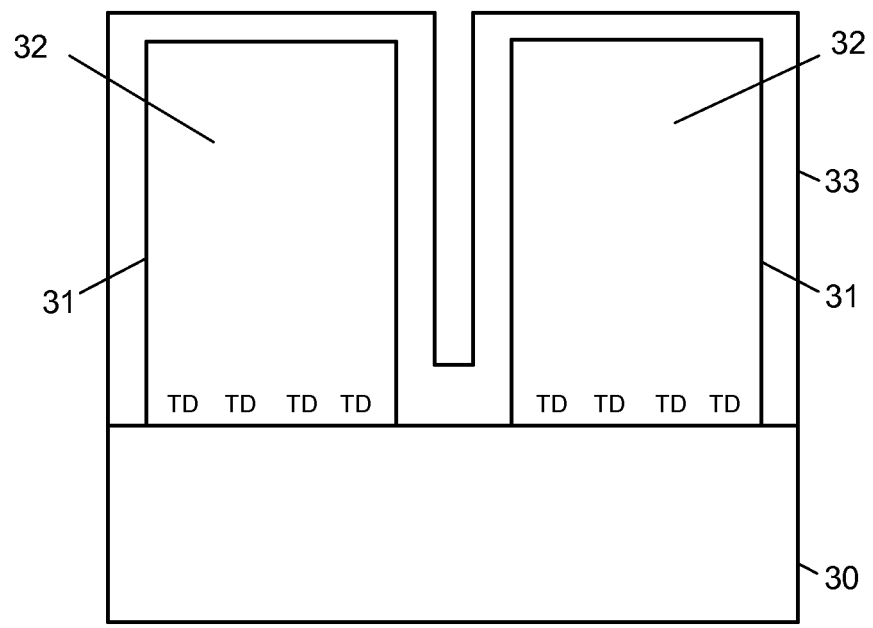

At 42 in FIG. 4, large mesas 32, as depicted in FIG. 3B, are formed in a well-known manner, such as by patterning. The mesas can be, but are not limited to, between about 50 nm to about 200 nm square. A silicon-oxide ($SiO_2$) layer 33 is formed in a well-known manner on mesas 32 to protect the SiGe from reflow in a subsequent mesa anneal. In one exemplary embodiment, the $SiO_2$ layer 33 has a thickness of about 3 nm to about 5 nm. The oxide layer 33 could be a dielectric other than $SiO_2$ as long as the dielectric has a weak shear strength for easy dislocation movement, has sufficient strength to protect a SiGe mesa from a deforming reflow during the mesa anneal, and is easily removed later after the mesa anneal.

Figure 3C:
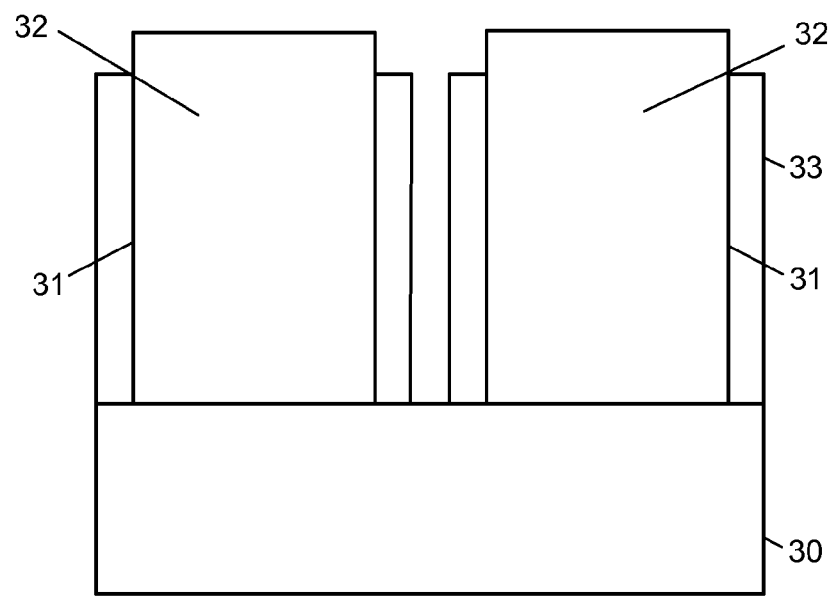

At 43 in FIG. 4, a mesa anneal is performed on the patterned mesas 32 in FIG. 3C for TD removal using image-force gliding, and thereby providing 100% relaxation of the mesas. The mesa anneal provides the activation energy for the dislocations to be remove. Threading dislocations (TD) are removed by gliding using an image force that is created by the spaces formed by the patterning. Dislocations in the epitaxial mesa structure glide under the influence of an image force, which is induced by a zero stress at the edge of the mesa. The mesa-anneal should have a temperature that is sufficiently high (e.g., 600-1000° C. in an $N_2$ atmosphere) for about 10 minutes to about 2 hours, but low enough to avoid SiGe fin reflow, thereby preserving the mesa integrity. Afterward, a top portion of $SiO_2$ layer 33 is removed to expose the SiGe mesas. A typical wet clean and in-situ high-temperature prebake to remove native oxide is then performed. During the high-temperature prebake, a reflow of the SiGe layer 31 may occur.

Figure 3D:
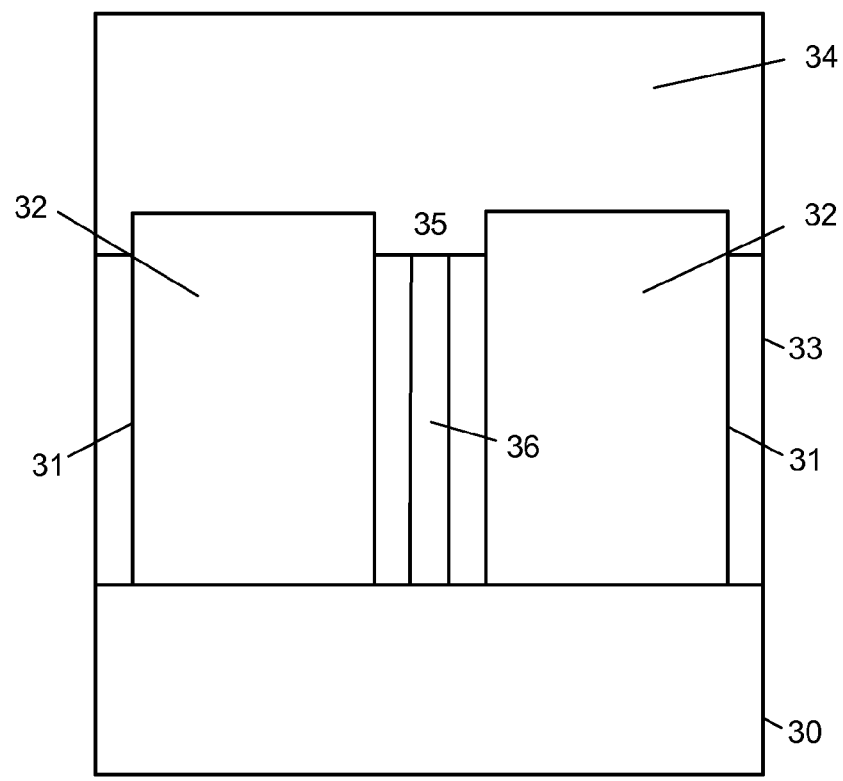

At 44 in FIG. 4, a second EPI process is performed on the exposed portion of mesas 32 in FIG. 3D to grow a SiGe layer 34 on mesas 32. The SiGe layer 34 is lattice-matched to SiGe mesas 32. The EPI process provides 100% coverage of mesas 32 and with a pinch off 35 at the top of the spacing between mesas 32 to leave a void 36 that comprehends any lattice mismatch. Afterward, a chemical-mechanical planarization (CMP) is performed in a well-known manner to flatten the top of the SiGe layer 34. The SRB is now ready for further processing to form circuit structures, such as, but not limited to fins for FinFETs.

In some exemplary embodiments, a SiGe SRB can be formed comprising a top portion generally having a Ge % that is greater than about 30%, and Threading Dislocation Density (TDD) that is less than about $1 \times 10^5$ $TD/cm^2$. In other exemplary embodiments, a SiGe SRB can be formed comprising a top portion generally having a Ge % that is greater than about 30%, and TDD that is less than about $1 \times 10^4$ $TD/cm^2$. In still other exemplary embodiments, a SiGe SRB can be formed comprising a top portion generally having a Ge % that is greater than about 30%, and TDD that is less than about $1 \times 10^3$ $TD/cm^2$.

Figure 1D:
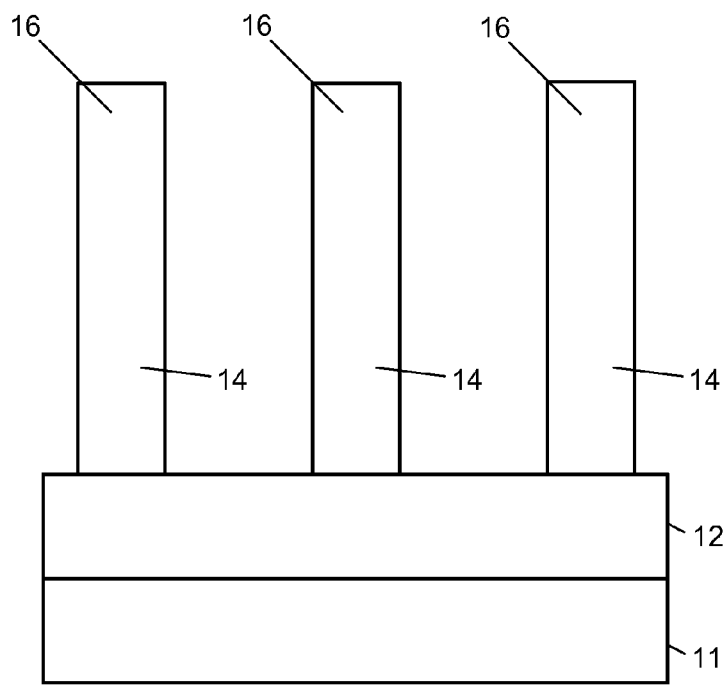

In another exemplary embodiment, the semiconductor device (i.e., the fin structure(s)) depicted in FIG. 1D could be used in place of the mesas 32 depicted in FIG. 3B. That is, mesas 32 could be patterned to have a size that corresponds to the size of a fin for a FinFET. The spacing between the patterned fins would be selected to provide a gap (gap 36 in FIG. 3D) having sufficient size to comprehend the expected strain relief for the size of the fins. Because fins that are formed according to the subject matter disclosed herein can provide a top portion that comprises a Ge % content of greater than about 85%, and with a TDD of less than about $1 \times 10^4$ TD/cm$^2$, the second SiGe layer 34 can comprise a similar Ge % content and TDD. In other exemplary embodiments, the second SiGe layer 34 could have a Ge % content that is greater than about 85%, and a TDD of less than about $1 \times 10^3$ TD/cm$^2$.

Figure 5:
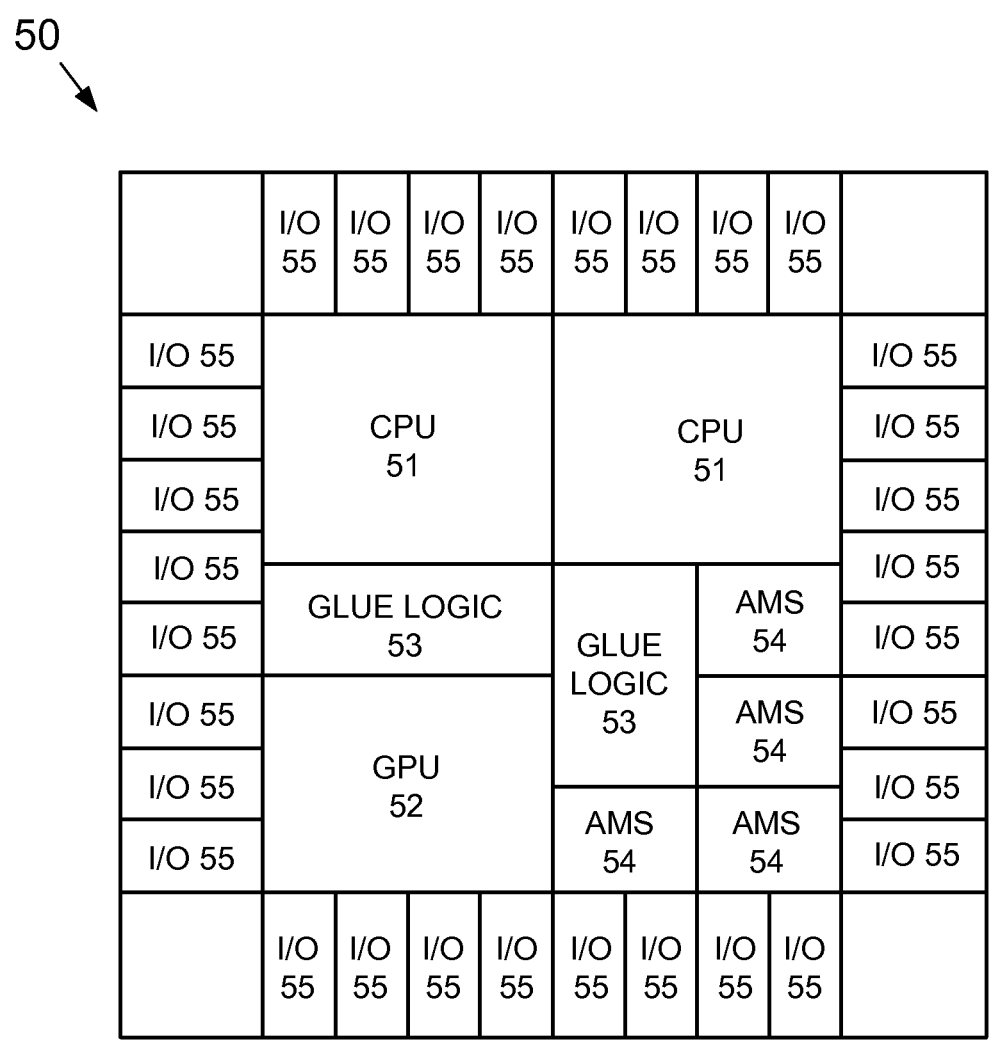

FIG. 5 depicts an exemplary arrangement of system components of a System on a Chip (SOC) 50 that comprises one or more semiconductor devices according to the subject matter disclosed herein. The exemplary arrangement of SOC 50 comprises one or more central processing units (CPUs) 51, one or more graphical processing units (GPUs) 52, one or more areas of glue logic 53, one or more analog/mixed signal (AMS) areas 54, and one or more Input/Output (I/O) areas 55. One or more of the different exemplary system components of SOC 50 may comprise one or more semiconductor devices according to the subject matter disclosed herein, such as SiGe fins and/or SiGe mesas and/or one or more strain-relieved buffers (SRBs). It should be understood that other arrangements of SOC 50 are possible and that SOC 50 could comprise other system components than those depicted in FIG. 5. SOC 50, which may comprise one or more semiconductor devices according to the subject matter disclosed herein, may be used in various types of electronic devices, such as, but not limited to, a computing device, a personal digital assistant (PDA), a laptop computer, a mobile computer, a web tablet, a wireless phone, a cell phone, a smart phone, a digital music player, or a wireline or wireless electronic device.

Figure 6:
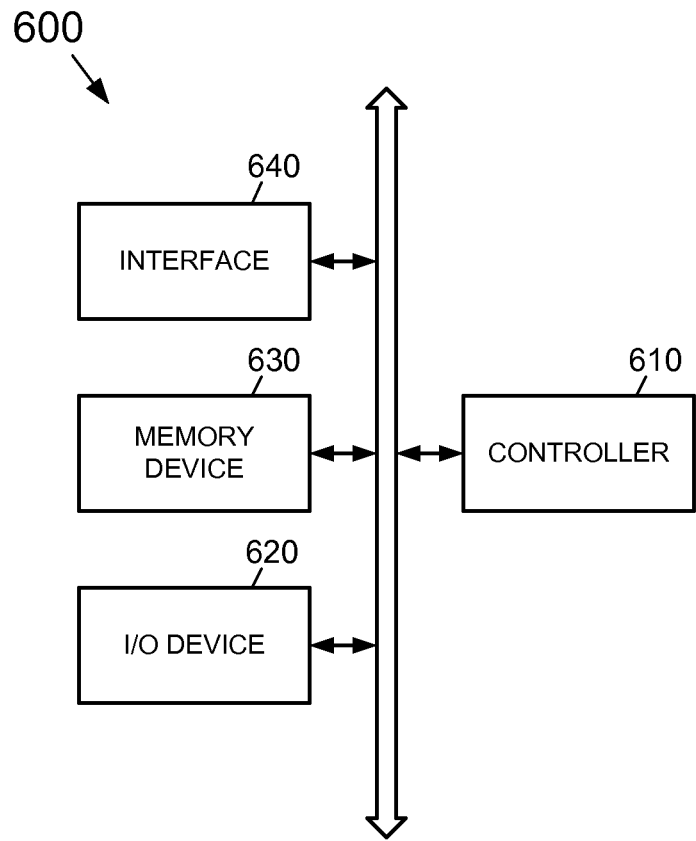
FIG. 6 depicts an electronic device that comprises one or more semiconductor devices according to exemplary embodiments disclosed herein.

FIG. 6, for example, depicts an electronic device 600 that comprises a semiconductor device according to exemplary embodiments disclosed herein. Electronic device 600 may be used in, but not limited to, a computing device, a personal digital assistant (PDA), a laptop computer, a mobile computer, a web tablet, a wireless phone, a cell phone, a smart phone, a digital music player, or a wireline or wireless electronic device. The electronic device 600 may comprise a controller 610, an input/output device 620 such as, but not limited to, a keypad, a keyboard, a display, or a touch-screen display, a memory 630, and a wireless interface 640 that are coupled to each other through a bus 650. The controller 610 may comprise, for example, at least one microprocessor, at least one digital signal process, at least one microcontroller, or the like. The memory 630 may be configured to store a command code to be used by the controller 610 or a user data. Electronic device 600 and the various system components comprising electronic device 600 may comprise one or more semiconductor devices according to exemplary embodiments disclosed herein. The electronic device 600 may use a wireless interface 640 configured to transmit data to or receive data from a wireless communication network using a RF signal. The wireless interface 640 may include, for example, an antenna, a wireless transceiver and so on. The electronic system 600 may be used in a communication interface protocol of a communication system, such as, but not limited to, Code Division Multiple Access (CDMA), Global System for Mobile Communications (GSM), North American Digital Communications (NADC), Extended Time Division Multiple Access (E-TDMA), Wideband CDMA (WCDMA), CDMA2000, Wi-Fi, Municipal Wi-Fi (Muni Wi-Fi), Bluetooth, Digital Enhanced Cordless Telecommunications (DECT), Wireless Universal Serial Bus (Wireless USB), Fast low-latency access with seamless handoff Orthogonal Frequency Division Multiplexing (Flash-OFDM), IEEE 802.20, General Packet Radio Service (GPRS), iBurst, Wireless Broadband (WiBro), WiMAX, WiMAX-Advanced, Universal Mobile Telecommunication Service—Time Division Duplex (UMTS-TDD), High Speed Packet Access (HSPA), Evolution Data Optimized (EVDO), Long Term Evolution—Advanced (LTE-Advanced), Multi-channel Multipoint Distribution Service (MMDS), and so forth.

Figure 7:
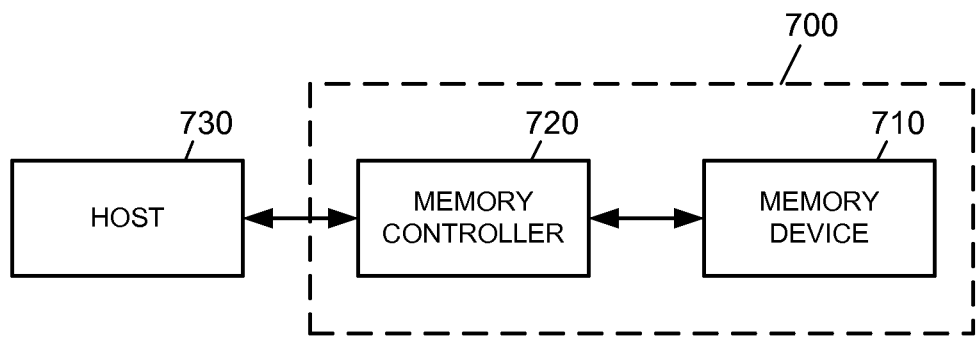
FIG. 7 depicts a memory system that comprises one or more semiconductor devices according to example embodiments disclosed herein.

FIG. 7 depicts a memory system 700 that may comprise one or more semiconductor devices according to example embodiments disclosed herein. The memory system 700 may comprise a memory device 710 for storing large amounts of data and a memory controller 720. The memory controller 720 controls the memory device 710 to read data stored in the memory device 710 or to write data into the memory device 710 in response to a read/write request of a host 730. The memory controller 730 may include an address-mapping table for mapping an address provided from the host 730 (e.g., a mobile device or a computer system) into a physical address of the memory device 710. The memory device 710 may comprise one or more semiconductor devices according to exemplary embodiments disclosed herein.

The exemplary semiconductor devices disclosed herein may be encapsulated using various and diverse packaging techniques. For example, the semiconductor memory devices comprising one or more exemplary semiconductor devices disclosed herein may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and a wafer-level processed stack package (WSP) technique. The package in which the semiconductor memory device according to one of the above exemplary embodiments is mounted may further include at least one semiconductor device (e.g., a controller and/or a logic device) that controls the semiconductor memory device. Additionally, the semiconductor memory devices disclosed herein may be part of a System on a Chip (SOC).

Figure 8:
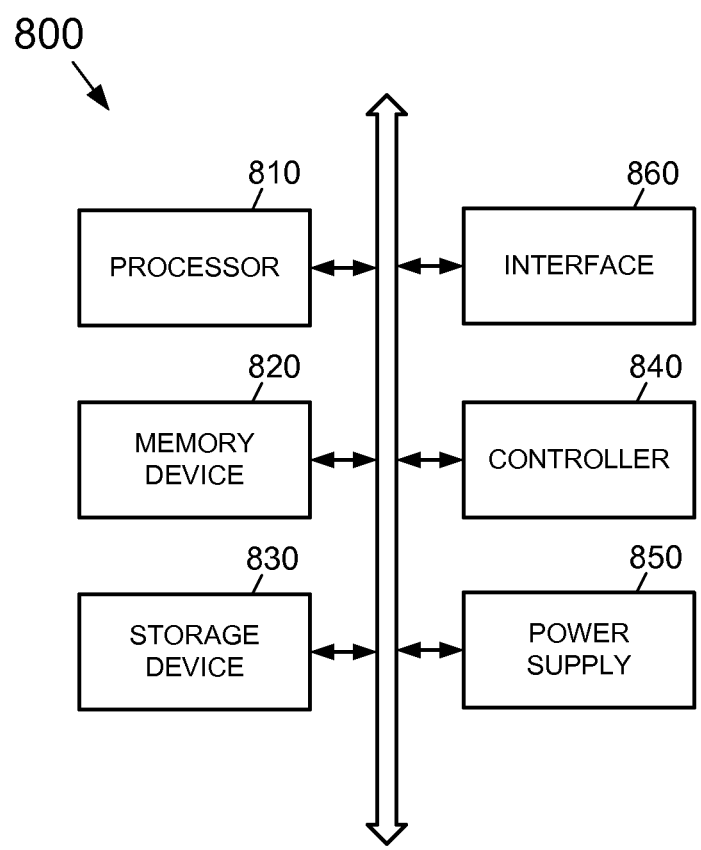
FIG. 8 depicts a block diagram illustrating an exemplary mobile device comprising one or more semiconductors device according to exemplary embodiments.

FIG. 8 depicts a block diagram illustrating an exemplary mobile device 800 comprising one or more semiconductor devices according to exemplary embodiments. Referring to FIG. 8, a mobile device 800 may comprise a processor 810, a memory device 820, a storage device 830, a display device 840, a power supply 850 and an image sensor 860. The mobile device 800 may further comprise ports that communicate with a video card, a sound card, a memory card, a USB device, other electronic devices, etc.

The processor 810 may perform various calculations or tasks. According to exemplary embodiments, the processor 810 may be a microprocessor or a CPU. The processor 810 may communicate with the memory device 820, the storage device 830, and the display device 840 via an address bus, a control bus, and/or a data bus. In some exemplary embodiments, the processor 810 may be coupled to an extended bus, such as a peripheral component interconnection (PCI) bus or a PCI Express (PCIe) bus. The memory device 820 may store data for operating the mobile device 800. For example, the memory device 820 may be implemented with, but is not limited to, a dynamic random access memory (DRAM) device, a mobile DRAM device, a static random access memory (SRAM) device, a phase-change random access memory (PRAM) device, a ferroelectric random access memory (FRAM) device, a resistive random access memory (RRAM) device, and/or a magnetic random access memory (MRAM) device. The memory device 820 comprises a magnetic random access memory (MRAM) according to exemplary embodiments disclosed herein. The storage device 830 may comprise a solid-state drive (SSD), a hard disk drive (HDD), a CD-ROM, etc. The display device 840 may comprise a touch-screen display. The mobile device 800 may further include an input device (not shown), such as a touchscreen different from display device 840, a keyboard, a keypad, a mouse, etc., and an output device, such as a printer, a display device, etc. The power supply 850 supplies operation voltages for the mobile device 800.

The image sensor 860 may communicate with the processor 810 via the buses or other communication links. The image sensor 860 may be integrated with the processor 810 in one chip, or the image sensor 860 and the processor 810 may be implemented as separate chips.

At least a portion of the mobile device 800 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP). The mobile device 800 may be a digital camera, a mobile phone, a smart phone, a portable multimedia player (PMP), a personal digital assistant (PDA), a computer, a tablet, etc.

Figure 9:
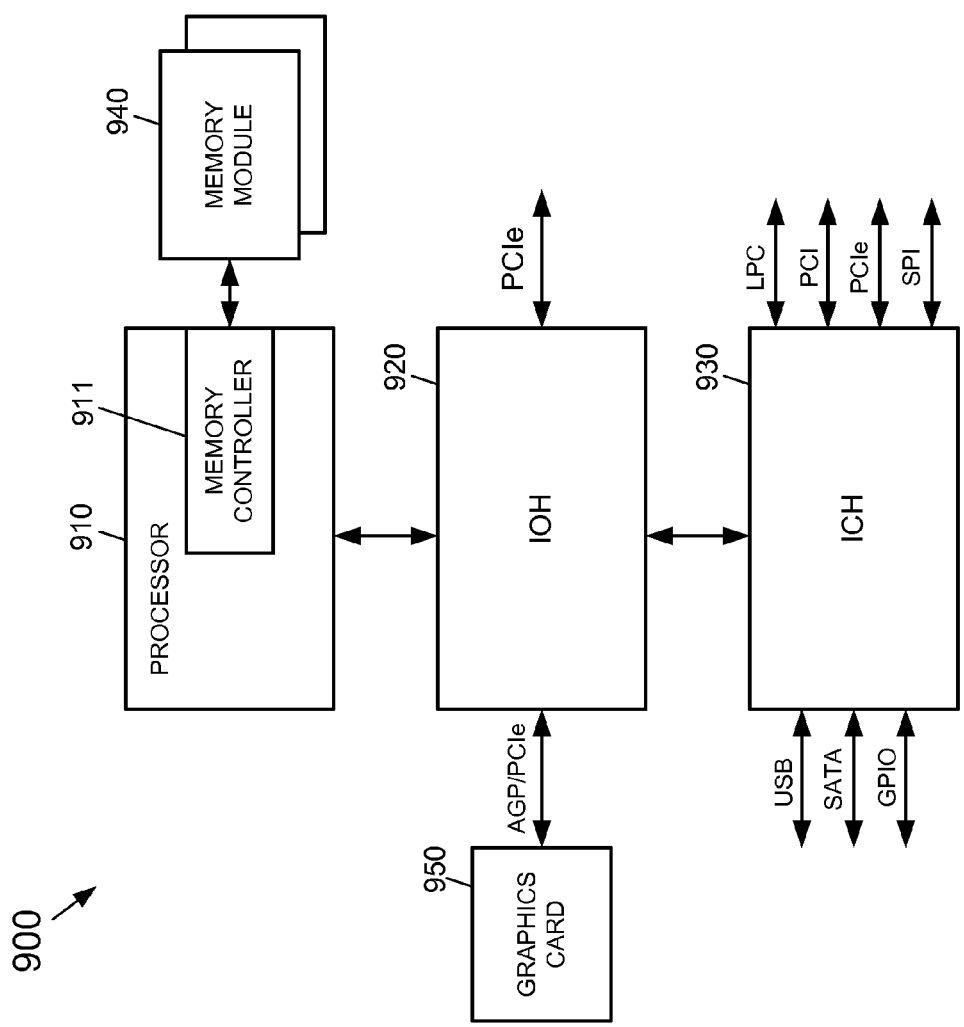
FIG. 9 depicts a block diagram illustrating a computing system including one or more semiconductor devices according to exemplary embodiments.

FIG. 9 depicts a block diagram illustrating a computing system 900 comprising one or more semiconductor devices according to exemplary embodiments. Referring to FIG. 9, a computing system 900 comprises a processor 910, an input/output hub (IOH) 920, an input/output controller hub (ICH) 930, at least one memory module 940 and a graphics card 950. In some exemplary embodiments, the computing system 900 may comprise a personal computer (PC), a server computer, a workstation, a laptop computer, a mobile phone, a smart phone, a personal digital assistant (PDA), a portable multimedia player (PMP), a digital camera), a digital television, a set-top box, a music player, a portable game console, a navigation system, etc.

The processor 910 may perform various computing functions, such as executing specific software for performing specific calculations or tasks. For example, the processor 910 may comprise a microprocessor, a central process unit (CPU), a digital signal processor, or the like. In some embodiments, the processor 910 may include a single core or multiple cores. For example, the processor 910 may be a multi-core processor, such as a dual-core processor, a quad-core processor, a hexa-core processor, etc. In some embodiments, the computing system 900 may comprise a plurality of processors. The processor 910 may comprise an internal or external cache memory.

The processor 910 may include a memory controller 911 for controlling operations of the memory module 940. The memory controller 911 included in the processor 910 may be referred to as an integrated memory controller (IMC). A memory interface between the memory controller 911 and the memory module 940 may be implemented with a single channel including a plurality of signal lines, or may bay be implemented with multiple channels, to each of which at least one memory module 940 may be coupled. In some embodiments, the memory controller 911 may be located inside the input/output hub 920, which may be referred to as memory controller hub (MCH).

The input/output hub (IOH) 920 may manage data transfer between processor 910 and devices, such as the graphics card 950. The input/output hub 920 may be coupled to the processor 910 via various interfaces. For example, the interface between the processor 910 and the input/output hub 920 may be a front side bus (FSB), a system bus, a HyperTransport, a lightning data transport (LDT), a Quick-Path interconnect (QPI), a common system interface (CSI), etc. In some exemplary embodiments, the computing system 900 may comprise a plurality of input/output hubs. The input/output hub 920 may provide various interfaces with the devices. For example, the input/output hub 920 may provide an accelerated graphics port (AGP) interface, a peripheral component interface-express (PCIe), a communications streaming architecture (CSA) interface, etc.

The graphics card 950 may be coupled to the input/output hub 920 via AGP or PCIe. The graphics card 950 may control a display device (not shown) for displaying an image. The graphics card 950 may include an internal processor for processing image data and an internal memory device. In some embodiments, the input/output hub 920 may include an internal graphics device along with or instead of the graphics card 950 outside the graphics card 950. The graphics device included in the input/output hub 920 may be referred to as integrated graphics. Further, the input/output hub 920 including the internal memory controller and the internal graphics device may be referred to as a graphics and memory controller hub (GMCH).

The input/output controller hub (ICH) 930 may perform data buffering and interface arbitration to efficiently operate various system interfaces. The input/output controller hub 930 may be coupled to the input/output hub 920 via an internal bus, such as a direct media interface (DMI), a hub interface, an enterprise Southbridge interface (ESI), PCIe, etc. The input/output controller hub 930 may provide various interfaces with peripheral devices. For example, the input/output controller hub 930 may provide a universal serial bus (USB) port, a serial advanced technology attachment (SATA) port, a general purpose input/output (GPIO), a low pin count (LPC) bus, a serial peripheral interface (SPI), PCI, PCIe, etc.

In some exemplary embodiments, the processor 910, the input/output hub 920 and the input/output controller hub 930 may be implemented as separate chipsets or separate integrated circuits. In other exemplary embodiments, at least two of the processor 910, the input/output hub 920 and the input/output controller hub 930 may be implemented as a single chipset.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present inventive concept. Accordingly, all such modifications are intended to be included within the scope of the appended claims.

What is claimed is:

1. A method to form a strain-relieved buffer (SRB), the method comprising:
   forming a first silicon-germanium (SiGe) layer directly on a surface of a bulk silicon (Si) substrate;
   patterning the first SiGe layer to form at least two SiGe structures so there is a space between the at least two SiGe structures;
   forming an oxide on the at least two SiGe structures;
   mesa annealing the at least two SiGe structures;
   removing a portion of the oxide to expose a top portion of the at least two SiGe structures; and
   forming a second SiGe layer on the exposed top portion of the at least two SiGe structures, the second SiGe layer covering the space between the at least two SiGe structures.

2. The method according to claim 1, wherein forming the first SiGe layer comprises forming the first SiGe layer by epitaxial deposition, and
   wherein forming the second SiGe layer comprises forming the second SiGe layer by epitaxial deposition.

3. The method according to claim 2, wherein a percentage Ge content of the first SiGe layer is substantially equal to a percentage Ge content of the second SiGe layer.

4. The method according to claim 3, wherein the percentage Ge content of the second SiGe layer is greater than 30%.

5. The method according to claim 4, wherein a threading dislocation (TD) density (TDD) of the second SiGe layer is less than $1\times10^5$ TD/cm$^2$.

6. The method according to claim 3, wherein patterning the first SiGe layer comprises patterning the first SiGe layer so that each SiGe structure comprises a length and a width in a direction along the surface of the bulk Si substrate, the space between each SiGe structure comprising a predetermined distance between each SiGe structure, and the predetermined distance being related to the length and the width of the SiGe structures adjacent to the space and an amount of stress relief that is associated with each SiGe structure.

7. The method according to claim 1, wherein the SRB is part of a System on a Chip (SOC).

8. The method according to claim 7, wherein the SOC is part of an electronic device comprising a touch-screen display.

9. A method to form a strain-relieved buffer (SRB), the method comprising:
   forming a first silicon-germanium (SiGe) layer on a surface of a substrate;
   patterning the first SiGe layer to form at least two SiGe structures so there is a space between the at least two SiGe structures, each SiGe structure comprising a length and a width in a direction along the surface of the substrate, the space between each SiGe structure comprising a predetermined distance between each SiGe structure, and the predetermined distance being related to the length and the width of the SiGe structures adjacent to the space and an amount of stress relief that is associated with each SiGe structure;
   forming an oxide on the at least two SiGe structures;
   mesa annealing the at least two SiGe structures;
   removing a portion of the oxide to expose a top portion of the at least two SiGe structures; and
   forming a second SiGe layer on the exposed top portion of the at least two SiGe structures, the second SiGe layer covering the space between the at least two SiGe structures.

10. The method according to claim 9, wherein the substrate is a bulk silicon (Si) substrate, and
    wherein the first silicon-germanium (SiGe) layer is formed directly on the surface of the bulk Si substrate.

11. The method according to claim 9, wherein forming the first SiGe layer comprises forming the first SiGe layer by epitaxial deposition, and
    wherein forming the second SiGe layer comprises forming the second SiGe layer by epitaxial deposition.

12. The method according to claim 11, wherein a percentage Ge content of the first SiGe layer is substantially equal to a percentage Ge content of the second SiGe layer.

13. The method according to claim 12, wherein the percentage Ge content of the second SiGe layer is greater than 30%, and
    wherein a threading dislocation (TD) density (TDD) of the second SiGe layer is less than $1\times10^5$ TD/cm$^2$.

14. The method according to claim 12, wherein the SRB is part of a System on a Chip (SOC), and
    wherein the SOC is part of an electronic device comprising a touch-screen display.

15. A method to form a strain-relieved buffer (SRB), the method comprising:
    forming a first silicon-germanium (SiGe) layer on a surface of a substrate;
    patterning the first SiGe layer to form at least two SiGe structures so there is a space between the at least two SiGe structures;
    forming an oxide on the at least two SiGe structures;
    mesa annealing the at least two SiGe structures;
    removing a portion of the oxide to expose a top portion of the at least two SiGe structures; and
    forming a second SiGe layer on the exposed top portion of the at least two SiGe structures, the second SiGe layer covering the space between the at least two SiGe structures, and a percentage Ge content of the first SiGe layer being substantially equal to a percentage Ge content of the second SiGe layer.

16. The method according to claim 15, wherein the substrate is a bulk silicon (Si) substrate, and
    wherein the first silicon-germanium (SiGe) layer is formed directly on the surface of the bulk Si substrate.

17. The method according to claim 16, wherein each SiGe structure comprising a length and a width in a direction along the surface of the substrate, the space between each SiGe structure comprising a predetermined distance between each SiGe structure, and the predetermined distance being related to the length and the width of the SiGe structures adjacent to the space and an amount of stress relief that is associated with each SiGe structure.

18. The method according to claim 15, wherein forming the first SiGe layer comprises forming the first SiGe layer by epitaxial deposition, and
    wherein forming the second SiGe layer comprises forming the second SiGe layer by epitaxial deposition.

19. The method according to claim 15, wherein the percentage Ge content of the second SiGe layer is greater than 30%, and
    wherein a threading dislocation (TD) density (TDD) of the second SiGe layer is less than $1\times10^5$ TD/cm$^2$.

20. The method according to claim 15, wherein the SRB is part of a System on a Chip (SOC), and wherein the SOC is part of an electronic device comprising a touch-screen display.

* * * * *